(12) United States Patent
Lerner et al.

(10) Patent No.: US 7,989,308 B2
(45) Date of Patent: Aug. 2, 2011

(54) CREATION OF DIELECTRICALLY INSULATING SOI-TECHNLOGICAL TRENCHES COMPRISING ROUNDED EDGES FOR ALLOWING HIGHER VOLTAGES

(75) Inventors: Ralf Lerner, Erfurt (DE); Uwe Eckoldt, Hohenfelden (DE); Thomas Oetzel, Iserlohn (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 866 days.

(21) Appl. No.: 10/599,726

(22) PCT Filed: Apr. 7, 2005

(86) PCT No.: PCT/DE2005/000618
§ 371 (c)(1),
(2), (4) Date: Jul. 31, 2007

(87) PCT Pub. No.: WO2005/098936
PCT Pub. Date: Oct. 20, 2005

(65) Prior Publication Data
US 2008/0265364 A1    Oct. 30, 2008

(30) Foreign Application Priority Data
Apr. 7, 2004    (DE) .......................... 10 2004 017 073

(51) Int. Cl.
*H01L 27/12*    (2006.01)
(52) U.S. Cl. ........ 438/425; 438/424; 438/428; 257/513; 257/E21.552
(58) Field of Classification Search .......... 438/424–428; 257/425, E21.552, E27.112, 51
See application file for complete search history.

(56) References Cited

U.S. PATENT DOCUMENTS

| 5,084,408 | A | | 1/1992 | Baba et al. |
| 5,416,041 | A | | 5/1995 | Schwalke |
| 5,470,781 | A | | 11/1995 | Chidambarrao et al. |
| 5,581,110 | A | | 12/1996 | Razouk et al. |
| 5,811,315 | A | | 9/1998 | Yindeepol et al. |
| 5,910,018 | A | * | 6/1999 | Jang .............................. 438/425 |
| 6,583,488 | B1 | * | 6/2003 | Xiang ........................... 257/506 |
| 6,784,042 | B2 | | 8/2004 | Salvatore |
| 6,849,521 | B2 | | 2/2005 | Arita et al. |
| 2002/0025654 | A1 | | 2/2002 | Arita et al. |

FOREIGN PATENT DOCUMENTS

| EP | 0 184 902 | 6/1986 |
| EP | 0 603 106 | 6/1994 |
| EP | 1 184 902 | 3/2002 |

(Continued)

OTHER PUBLICATIONS

English machine translation of Japanese Patent JP406349940A (Dec. 22, 1994).*

(Continued)

*Primary Examiner* — Thinh T Nguyen
(74) *Attorney, Agent, or Firm* — Duane Morris LLP

(57) ABSTRACT

The aim of the invention is to integrate low-voltage logic elements and high-voltage power elements in one and the same silicon circuit. Said aim is achieved by dielectrically chip regions having different potentials from each other with the aid of isolation trenches (10). In order to prevent voltage rises at sharp edges on the bottom of the isolation trenches, said edges are rounded in a simple process, part of the insulating layer (2) being isotropically etched.

7 Claims, 2 Drawing Sheets

FOREIGN PATENT DOCUMENTS

| | | |
|---|---|---|
| EP | 1 220 312 | 7/2002 |
| JP | 06-349940 | 12/1994 |
| JP | 406349940 A * | 12/1994 |
| WO | WO 86/06741 | 11/1986 |
| WO | WO 2005/098936 | 10/2005 |

OTHER PUBLICATIONS

PCT/DE2005/000618—International Preliminary Report on Patentability.

* cited by examiner

CREATION OF DIELECTRICALLY INSULATING SOI-TECHNLOGICAL TRENCHES COMPRISING ROUNDED EDGES FOR ALLOWING HIGHER VOLTAGES

The present invention generally relates to the fabrication of microstructures on insulating substrates and particularly relates to the fabrication of isolation trenches on SOI (silicon on insulator) substrates.

In order to integrate low-voltage logic devices and high-voltage power devices into the same silicon circuit it is frequently necessary to insulate chip regions of different potential from each other. One possibility therefore is the so-called dielectric isolation trench insulation. To this end a vertically acting insulation is formed between the device and the substrate by means of a buried insulating layer, for instance a silicon dioxide layer ($SiO_2$) or any other insulating layer. A laterally acting insulation is achieved by etching a trench to the buried insulating layer and subsequently refilling this deep trench with insulating layers. For this purpose only a portion of the etched trench may be refilled with the insulating material, and the further refilling of the trench may be performed by using a conductive fill layer, such as polysilicon. A planarization of the surface is achieved by so-called planarization steps including for instance appropriate etch processes or the chemical mechanical polishing. Prior art generally relating to the fabrication of isolation trenches without specific measures for patterning the edge geometry is disclosed, among others, in EP-A 1 184 902 and EP-A 1 220 312.

In many applications of SOI devices there is a tendency towards the usage of higher supply voltages. At sharp trench edges of the isolation trench a concentrated field strength may be generated, thereby causing voltage peaks and, at higher voltages, a voltage breakthrough. In order to avoid or reduce this effect the shape of the edges of the isolation trench may be modified.

In US-A 2002/0,025,654 in the respective FIGS. 14, 15*a* and 15*b* an isolation trench structure is shown, in which the corresponding edges are chamfered. In this way peaks of the field strength at the silicon edges are reduced. A more detailed description of the manufacturing process is, however, not provided therein. It may be concluded from the structure shown that the chamfering is provided at the beginning and at the end of the actual etch process of the isolation trench. This requires a complex etch process that is difficult to control.

It is an object of the present invention to provide a simple but nevertheless efficient technique for rounding the trench edges of isolation trenches so as to reduce or avoid an adverse concentration of the field strength. Generally, the present invention is based on the inventors' finding that the critical locations that may contribute to an undesired concentration of the field strength and thus voltage peaks include the area of the transition of the trench wall to the trench bottom, i.e., the horizontally extending insulating layer.

Hence, in view of a simple and efficient method the present invention provides a technique for forming a rounded trench edge just in this transition area, which is effective substantially in this area, while a corresponding rounding at the upper trench edges is not necessary.

Based on this finding the object described above is solved by a method for creating a dielectric insulating trench comprising rounded edges of active silicon layer areas located adjacent to the trench and at a transition to a buried insulating layer of an SOI structure. The method further comprises performing an etch process consisting of two steps, wherein in the first step the trench is etched to the insulating layer and wherein in the second step under-etched areas are formed at sidewalls of the trench by isotropically etching a portion of the insulating layer. Moreover, the method comprises, after performing the etch process, thermally oxidising surfaces of the trench and the under-etched areas.

The method of the present invention thus allows the rounding of trench edges at the trench bottom by a very simply structured etch process comprising two steps, of which the first step is a selective anisotropic etch process for etching of a silicon layer or a silicon containing layer until the insulating layer is reached. Then the second etch step follows that is an isotropic etch process and selectively removes substantially material of the insulating layer, thereby creating the under-etched areas at the sidewalls of the trench. In the subsequent thermal oxidation process an increased oxidation rate is obtained near the edge, since the oxygen diffusion can occur at two surface areas, thereby resulting in an overall increased oxidation rate in the edge region compared to adjacent surface areas of the silicon and thus creating a rounded oxide layer. Well-established process techniques may be used for the etch process including the two selective etch processes, thereby obtaining a well controllable edge rounding process at the transition region of the trench walls at the trench bottom, while a process flow of relatively low complexity provides for a cost effective fabrication of rounded isolation trenches in SOI substrates.

In a further advantageous embodiment the insulating layer is used as an etch stop layer during the first step. Consequently, well-approved anisotropic selective etch processes may be used for etching silicon, wherein, if the insulating layer is formed of silicon dioxide, a high degree of selectivity is obtained for well-approved silicon etch processes so that a well controllable trench etch step may be accomplished. Furthermore, according to the present invention it is not necessary to add a further anisotropic etch process during which the trench would be etched into the insulating layer, since due to the subsequent isotropic etch process for the material of the insulating layer the desired under etching and thus the exposure of e further surface in the vicinity of the silicon edge may reliably be achieved.

In a further embodiment a degree of material removal at the sidewalls of the trench in the second step is low due to the selectivity of the isotropic etch process, thereby essentially not causing a rounding at upper and lower edges of the trench. Due to the selectivity of the second step specific measures are not necessary during the second etch step, since in particular at the upper trench edge a pronounced rounding is not desired during the subsequent thermal oxidation process.

According to a further aspect of the present invention the above-described object is solved to another method for creating dielectrically insulating trenches having rounded edges of active silicon regions at a transition to a buried insulating layer of an SOI structure. In this case an isotropic etch process of the buried insulating layer is performed after etching the isolation trench, wherein under-etched areas are formed in the buried insulating layer. Subsequently, a thermal oxidation is preformed to create an insulating layer on vertical walls of the isolation trench and on the top faces of the under-etched areas.

Advantageously, in this case the buried insulating layer is provided as a silicon dioxide layer.

With respect to this further aspect the same advantages may be achieved as already discussed above.

The present invention will be explained and completed on the basis of illustrative embodiments, while it should be appreciated that the following description represents the description of preferred embodiments of the invention.

It is to noted that throughout the drawings components corresponding to each other are denoted by the same reference numerals.

For emphasizing the advantages of the invention and its embodiments a device having an isolation trench formed according to conventional manufacturing techniques will be described with reference to FIGS. 1 and 2.

Figure 1:
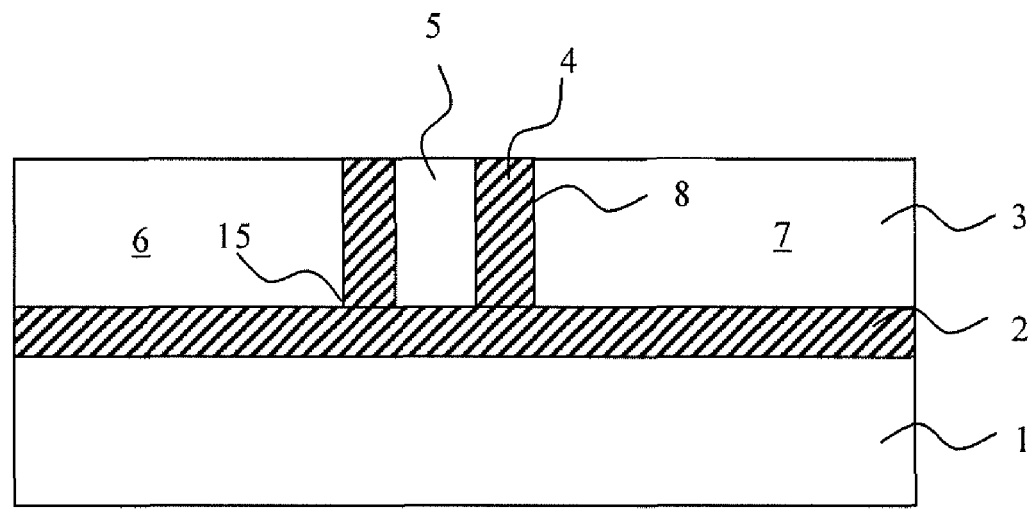
FIG. 1 illustrates an isolation trench formed in accordance with common SOI technology after etching, filling and planarization.

In FIG. 1 the conventional prior art is illustrated, for convenience. A substrate 1 that may also be referred to as a handling wafer has formed thereon a buried oxide layer 2, above which is located an active silicon layer 3 that is divided into neighbouring regions 6 and 7 by a trench 8 comprising insulating layers 4 and a filling 5, wherein the regions 6 and 7 are thus appropriate for applying different potentials. Upon applying a first potential to the "island" i.e., the region 6 and upon applying of a corresponding second potential to the "island" i.e., the region 7 and the carrier substrate 1, respectively, a concentration of the field strength and hence a voltage increase may occur due to the specific geometry.

Figure 2:
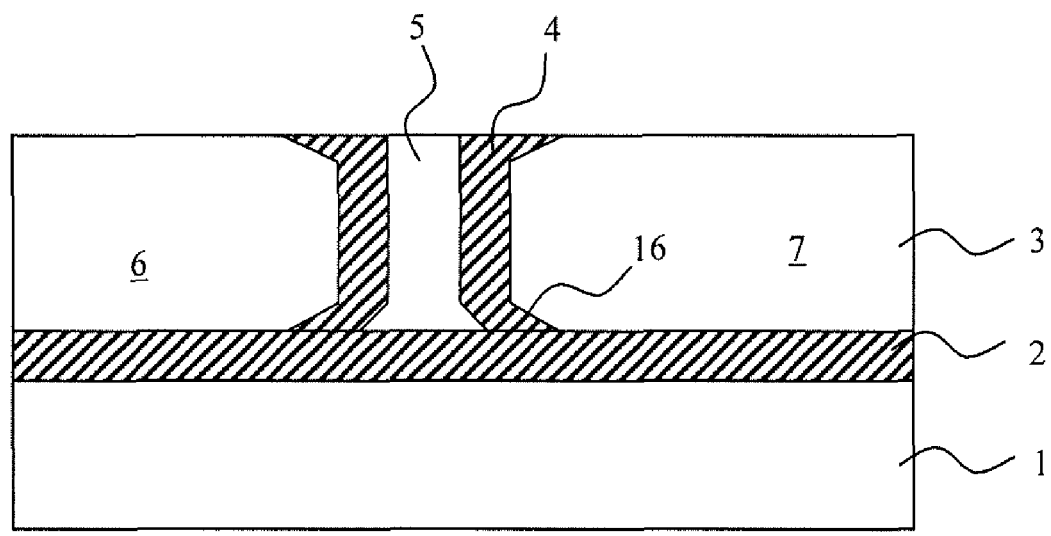
FIG. 2 depicts an isolation trench having chamfered edges as is disclosed in US-A 2000/0,025,654.

FIG. 2 shows a respective structure according to the prior art as described in US-A 2002/0,025,654, wherein respective chamfered edges are provided at the top side and the bottom side of the insulating layer connecting to the regions 6 and 7. A respective chamfering at the bottom side, i.e., at a transition area to the buried oxide layer 2, is denoted by reference numeral 16.

Essentially, a chamfering or rounding is obtained at the bottom side of a respective isolation trench for reducing voltage peaks so that a corresponding chamfering at the top side may be avoided. A rounding of the edges of the active regions 6 and 7 above the buried insulating layer 2 for avoiding of peaks of the field strength may be achieved in a very efficient manner with a low degree of complexity in a way as will be described with reference to FIGS. 3 and 4 below.

Figure 3:
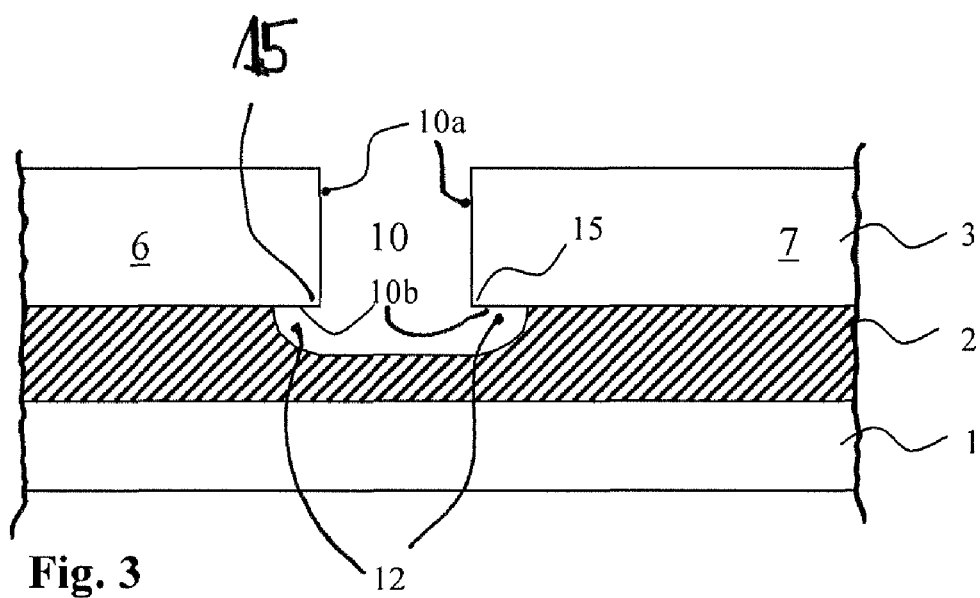
FIG. 3 shows a sectional view of a sub step of the method for forming one of a plurality of isolation trenches, wherein the isolation trench is shown after an isotropic etch step for removing material from the horizontal insulating layer.

FIG. 3 shows a carrier substrate 1 on which is located a buried insulating layer 2 and which is comprised, in one particular embodiment, of silicon dioxide, above which an active layer 3, typically a silicon layer, is provided. The active layer 3 is divided into a first region 6 and a second region 7 by a trench 10, wherein for instance circuit elements to be operated at different operating voltages may be formed in the first and second regions 6 and 7. As shown, the trench 10 comprises substantially vertical sidewalls 10a in the active layer 3. Moreover, a part of the material in the buried insulating layer 2 is removed below the trench 10 such that under-etched areas 12 exposing further surfaces 10b of the active layer 3, i.e., of the regions 6 and 7, are defined in the buried insulating layer 2

The structure as shown in FIG. 3 may be formed as follows.

The carrier substrate 1, the buried insulating layer 2 and the active layer 3 may be formed as an SOI substrate on the basis of known techniques. Next, a trench etch process is performed to form the trench 10 in the active layer 3. For this purpose known lithographical methods for forming a respective resist mask may be used, followed by an anisotropic etch process on the basis of an etch chemistry that is appropriate for etching the material of the layer 3. For anisotropic silicon etch processes respective approved etch procedures are known that may advantageously be used for this purpose, wherein these procedures typically have a high degree of selectivity with respect to the buried insulating layer 2 that may be provided, for instance, in the form of silicon dioxide, so that the anisotropic etch process for the trench 10 substantially stops at the buried insulating layer 2.

After the step of etching the trench 10 a second step is performed that includes an isotropic etch process in order to etch the buried insulating layer 2 such that an under-etching is obtained, i.e., regions 12 are formed below the layer portions 6 and 7, thereby exposing the respective surfaces 10b. As is evident from FIG. 3, only a part of the buried insulating layer 2 is removed during this isotropic etch process, so that still a separation with respect to the carrier substrate 1 located below is maintained, preferably approximately half of the thickness of the layer 2 is maintained.

Moreover, FIG. 3 illustrates that the isotropic etch process for removing a part of the buried insulating layer 2 for forming the under-etched regions 12 is highly selective and hence essentially no material of the layer 3 or 6/7 is removed and thus (substantially) no rounding of edges at the top or of edges 15 at the bottom of the trench 10 (upper and lower ends of the trench) may occur.

The material removal at the sidewalls of the trench is "low" and preferably substantially zero due to the selectivity of the isotropic etch process, which however results in an under-etching 12 on both sides that is shown with less than half of the trench width. Compared to the depth/thickness of the insulating layer 2 the amount of removal is approximately half of the thickness, that is, into the depth and into the respective width.

Substantially zero is to be understood as not measurable.

After the end of the etch process, consisting of the first trench etch process and the second isotropic process for removing material from the buried insulating layer 2, a thermal oxidation process is performed in order to form an insulating layer on exposed surfaces of the trench 10 and 10b, respectively, not shown yet.

Figure 4:
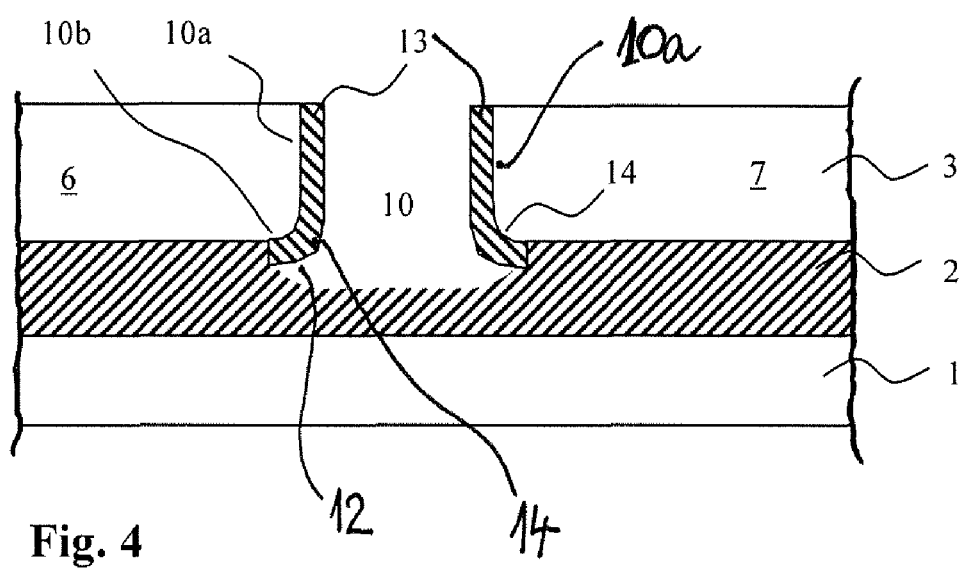
FIG. 4 illustrates a schematic cross-sectional view of a device having the isolation trench 10 after a thermal oxidation.

FIG. 4 depicts the structure after performing the thermal oxidation process. Here, the trench insulation layers 13 are now provided, which cover the sidewalls 10a and the bottom faces 10b. For convenience, a respective thermal oxide layer on the upper surface of the layer 3 or 6/7 is not shown.

When performing the thermal oxidation process the oxidation rate at the (respective) edge 15 (cf. FIG. 3) is significantly higher compared to a neighbouring area of the respective side face 10a and the lower surface 10b in the vicinity of the insulating layer 2. Hence, during the oxidation a rounding 14 is formed at the edge 15 at a transition area defined by the sidewall of the isolation trench and the buried insulating layer 2.

A further process for filling the trench 10 may be continued in a conventional manner by, for example, depositing a fill material 5 as is shown in FIGS. 1 and 2.

Due to this approach, that is, using an etch process including two etch steps, wherein first a trench is anisotropically etched and subsequently material of the buried insulating layer is isotropically removed so as to expose an under-etched region, followed by a thermal oxidation of these under-etched regions exposed by the second etch step, two effects are obtained.

First, the oxidation rate decreasing with increasing depth is compensated for, at least to a certain degree, due to the oxidation attack from two sides, that is, a thicker oxide is formed.

Second, the oxidation attack from both sides, i.e., the attack of the sidewall 10a in the vicinity of the edge 15 and the attack at the exposed surface 10b of the under-etched region 12 in the vicinity of the edge 15, results in a rounded oxidised "edge" 14 (as a longitudinally extending rounding).

In one embodiment a method for creating the dielectric isolation trench 8 having rounded edges 14 of the active silicon regions 6 and 7 at the transition to the buried insulating layer 2 of an SOI structure has the following process flow.

After etching the trench 10 the buried insulating layer 2 is isotropically etched, thereby creating the under-etched regions 12. Thereafter, a thermal oxidation is performed to create a respective insulating layer 13 on opposing walls of the trench (having vertical walls).

The invention claimed is:

1. A method for manufacturing, forming or creating at least one dielectrically insulating trench (10) comprising rounded edges (14) of active silicon layer portions (6,7;3) adjacent to the trench, each of said rounded edges (14) located at a respective transition area (14) connecting to a buried insulating layer (2) of an SOI structure, said method comprising performing an etch process consisting of two steps, wherein in the first step of the etch process said trench (10) is etched to the insulating layer (2);

in the second step of the etch process under-etched regions (12) are formed on sidewalls of the trench (10) by isotropically etching a part of the insulating layer (2), said under-etched regions having a width and a depth that correspond approximately to half of a thickness of said buried insulating layer;

after performing said etch process thermally oxidizing surfaces of said trench (10) and said under-etched regions (12).

2. The method of claim 1, wherein said insulating layer (2) is used as an etch stop layer during said first step.

3. The method of claim 1 or 2, wherein in said second step a material removal at both sidewalls of the at least one trench (10) is small due to a selectivity of the isotropic etching, thereby substantially not resulting in a rounding of upper and lower edges of the trench (10).

4. The method of claim 3, wherein the material removal at the respective two sidewalls (10b) does not result in a rounding of upper and lower edges of the trench (10).

5. The method of claim 1 or 2, wherein the thermal oxidation is performed for creating the insulating layers (13) on the vertical walls (10a) of the isolation trench (10) and on surfaces (10b) of the under-etched regions (12).

6. The method of claim 1, wherein the buried insulating layer (2) is an SiO2 layer.

7. SOI wafer comprising at least one and preferably a plurality of dielectrically insulating trenches (10) having rounded edge (14) formed of active silicon layer portions (6, 7; 3) located adjacent to the trench, said rounded edges (14) located at a respective transition area (14) connecting to a buried insulating layer (2), said rounded edges (14) delineating under-etched regions having a width and a depth that correspond to substantially half of a thickness of said buried insulating layer.

* * * * *

UNITED STATES PATENT AND TRADEMARK OFFICE
CERTIFICATE OF CORRECTION

PATENT NO.         : 7,989,308 B2                                Page 1 of 1
APPLICATION NO.    : 10/599726
DATED              : August 2, 2011
INVENTOR(S)        : Ralf Lerner et al.

It is certified that error appears in the above-identified patent and that said Letters Patent is hereby corrected as shown below:

Column 6, line 23, delete "edges" and insert --edge--.

Signed and Sealed this
Twenty-fourth Day of January, 2012

David J. Kappos
*Director of the United States Patent and Trademark Office*